United States Patent
Hu

(10) Patent No.: US 8,912,930 B2
(45) Date of Patent: Dec. 16, 2014

(54) CAPACITIVE TOUCH KEYBOARD

(71) Applicant: Touchplus Information Corp., New Taipei (TW)

(72) Inventor: Shih Hsien Hu, New Taipei (TW)

(73) Assignee: Touchplus Information Corp., New Taipei (TW)

( * ) Notice: Subject to any disclaimer, the term of this patent is extended or adjusted under 35 U.S.C. 154(b) by 92 days.

(21) Appl. No.: 13/829,275

(22) Filed: Mar. 14, 2013

(65) Prior Publication Data

US 2014/0266814 A1 Sep. 18, 2014

(51) Int. Cl.
*H03M 11/00* (2006.01)

(52) U.S. Cl.
USPC ............... 341/26; 341/20; 345/173; 345/174; 178/18.01; 178/18.06

(58) Field of Classification Search
USPC .......... 341/20, 22, 25, 26; 345/173, 174, 177, 345/178; 324/661, 662; 178/18.01, 18.06; 340/562, 5.53
See application file for complete search history.

(56) References Cited

U.S. PATENT DOCUMENTS

| 8,440,920 B2* | 5/2013 | Bulea et al. | 178/18.06 |
| 8,665,224 B2* | 3/2014 | Liao et al. | 345/173 |
| 2012/0092127 A1* | 4/2012 | Ganapathi et al. | 340/5.53 |
| 2014/0097857 A1* | 4/2014 | HU, Shih Hsien | 324/661 |

* cited by examiner

*Primary Examiner* — Hung T. Nguyen
(74) *Attorney, Agent, or Firm* — Muncy, Geissler, Olds & Lowe, P.C.

(57) ABSTRACT

A capacitive touch keyboard includes a sensor layer, ground plane, a flexible sensed body, and a sensing circuit. The sensor layer includes a substrate and a key sensing cell which disposed on the substrate spaced apart from the ground plane. The flexible sensed body includes a sensed portion and a connected portion connected with the ground plane where the sensed portion obliquely extends to above the key sensing cell such that the flexible sensed body and the key sensing cell jointly form a capacitor structure. The sensing circuit is electrically connected to the sensing cell for probing a capacitance change. Therefore, features of more simplified structure design, tactile feel, and improved durability are provided in a capacitive keyboard.

20 Claims, 9 Drawing Sheets

CAPACITIVE TOUCH KEYBOARD

FIELD OF THE INVENTION

The invention is relevant to a keyboard device, especially to a capacitive touch keyboard offering depression tactile feeling and even gesture operation functionality.

DESCRIPTION OF THE PRIOR ART

Presently, most known keyboard device can be categorized into two types, contact type and contactless type. The first one is mostly referred to mechanical keyboard and membrane keyboard, in which current flows through contact points to provide pressing signals to a control circuit as input in response to depressing of a finger on a keyboard key. A circuit model for such conventional keyboard is shown in FIG. 1 as a 5×8 keyboard matrix. A short circuit is formed upon depressing action of user's finger on a keycap such that the depressed key can be detected.

As to the second one, contactless type keyboard, a representative product is capacitive keyboard, including mechanical type, touch button type, and virtual keyboard. A mechanical capacitive keyboard is shown in FIG. 2, in which when a user depresses a keycap 911, a top plate 912 is pushed toward a printed circuit board (PCB) 913 laid on bottom so that a capacitance between two plates 912 and 913 is changed and then detected for achieving input purpose.

Referring to FIG. 3, an illustration of a conventional touch button type capacitive keyboard; in the keyboard, alternating current normally flows through a circuit. When a user depresses a key 921 with his finger, the capacitance of the keyboard is changed and is detected by a sensing controller 922 as a key input.

Nowadays, projective capacitive touch technology has been widely used in various consumer products such as mobile phones, tablets, or the like, in which a virtual type keyboard is utilized. The virtual keyboard is capable of identifying location (in coordinate sense) of a finger on a screen as key input, employs the same concept of identifying capacitance change while the finger is touching on a key as the capacitive keyboard above. FIGS. 4A and 4B show two kinds of capacitance sensing structure as one component of a virtual keyboard, one for double side bar type and the other for single side diamond type with bridge, and both of which are referred to two dimensional matrix electrode arrangement.

To sum up, conventional contact keyboard has drawbacks of poor reliability due to contact points and susceptibility to contamination while contactless keyboard is either expensive or lacking in tactile feel for depressing.

SUMMARY OF THE INVENTION

One objective of the present invention is to improve drawbacks of high cost and a lack of tactile feel for depressing in conventional capacitive keyboard.

Another objective of the present invention is to provide a capacitive touch keyboard not only offering tactile feel and gesture operation but also improving its durability.

To achieve the objectives above and others, a capacitive touch keyboard of the invention comprises a sensor layer, a ground plane, a flexible sensed body, and a sensing circuit. The sensor layer includes a substrate and a key sensing cell which is disposed, along with the ground plane in spaced way, on the substrate.

The flexible sensed body includes a sensed portion and a connected portion wherein the connected portion mechanically and electrically connected with the ground plane such that the flexible sensed body is equipotential with respect to the ground plane, and the sensed portion extends from the connected portion to above the key sensing cell (i.e. a gap is left therebetween) such that the flexible sensed body and the key sensing cell jointly form a capacitor structure.

The key sensing cell and the capacitance sensing circuit are electrically connected with each other.

Through the keyboard design of the present invention, simplified structure is involved and a user is provided with clear tactile feel as downward deflection when his finger pushes down a keyboard key because of deflection motion of the flexible sensed body attached to the key cap, and at the same time a clearance between the sensed body, which is equipotential with the ground plane, and the sensing cell of the sensor layer is also shortened so that a change on the capacitance of the keyboard is generated allowing the sensing circuit to recognize the depressed key.

The keyboard structure of the present invention features that a user need not push a key down to the bottom for contacting with other component and hence wearout and elastic fatigue problems are avoided, improving product durability.

The key sensing cell may be shaped to have six sides and an inner protrusion, for example, of hexagonal contour. The six sides form a loop to define an inner space to which the inner protrusion extends from one of the sides. The ground plane disposed within the inner space surrounds the inner protrusion without contact. The inner protrusion is adapted for depression sensing and six sides for proximate detection.

The flexible sensed body may be a dome in terms of its appearance and made of metal. A conductive line or lines connect the sensing cells of the sensor layer to the sensing circuit and these lines may be integrated in a flexible printed circuit (FPC).

Each sensing cell may be hexagon-shaped so as to exhibit a honeycomb pattern altogether, and in such way a better resolution in gesture operation is achieved.

In another embodiment, a capacitive touch keyboard comprises a sensor layer, plural ground planes, plural flexible sensed body, and a sensing circuit. The sensor layer includes a substrate and plural key sensing cells with each cell having six sides looped to define an inner space, and an inner protrusion extending from one of the sides into the inner space.

The ground planes correspond to the key sensing cells and each ground plane is spaced apart from the corresponding key sensing cell on the substrate. Each ground plane within the inner space surrounds the inner protrusion without contacting.

The flexible sensed bodies also correspond to the key sensing cells and each flexible sensed body includes a sensed portion and a connected portion. The connected portion is connected with the corresponding ground plane and the sensed portion extends from the connected portion to above the inner protrusion of the key sensing cell such that the combination of the flexible sensed body and the key sensing cell form a capacitor structure.

The capacitance sensing circuit is electrically connected with the key sensing cell for probing a capacitance change.

Between adjacent key sensing cells a gesture sensing cell may be interposed, and preferably, the gesture sensing cell has the same profile as the key sensing cell. The gesture sensing cell is disposed to correspond to a space between the adjacent keyboard keys for gesture operation.

Preferably, all sensing cells mentioned above are hexagonal and arranged to be a honeycomb pattern so as to obtain the most sensitive sensing mode.

The sensor layer may comprise a plurality of key sensing cells disposed on the substrate and corresponding to a plurality of flexible sensed bodies, respectively, and the key sensing cells comprises respective circumferential portions uncovered from the corresponding flexible sensed bodies.

The sensing circuit may be electrically connected to the plurality of key sensing cells for sensing both an electronic parameter change correlating to the clearance between a selected one of the key sensing cells and the corresponding one of the flexible sensed bodies, and a capacitance change resulting from a finger movement above and among the plurality of key sensing cells. The electronic parameter change may be a capacitance change or a voltage change when the clearance between one of the key sensing cells and the ground plane is substantially zero as the key sensing cells and the ground plane are in contact with each other.

The key sensing cell may comprise a first part and a second part disposed on opposite sides of the substrate and electrically connected with each other, and the sensed portion extends to above the second part.

BRIEF DESCRIPTION OF THE DRAWINGS

The primitive objectives and advantages of the present invention will become apparent upon read the following description and upon reference to the accompanying drawings in which.

DESCRIPTION OF THE PREFERRED EMBODIMENT

The present invention provides a capacitive touch keyboard featuring that whole structure is quite simplified, tactile feel is provided upon depressing action, and keyboard is rather durable.

In order to fully understand the manner in which the above-recited details and other advantages and objects according to the invention are obtained, a more detailed description of the invention will be rendered by reference to the best-contemplated mode and specific embodiments thereof. The following description of the invention is made for the purpose of illustrating the general principles of the invention and should not be taken in a limiting sense; it is intended to illustrate various embodiments of the invention. As such, the specific modifications discussed are not to be construed as limitations on the scope of the invention. It will be apparent to one skilled in the art that various equivalents, changes, and modifications may be made without departing from the scope of the invention, and it is understood that such equivalent embodiments are to be included herein. The terminology used in the description presented below is intended to be interpreted in its broadest reasonable manner, even though it is being used in conjunction with a detailed description of certain specific embodiments of the invention. Certain terms may even be emphasized below; however, any terminology intended to be interpreted in any restricted manner will be overtly and specifically defined as such in this detailed description section. Where the context permits, singular or plural terms may also include the plural or singular term, respectively. Moreover, unless the word "or" is expressly limited to mean only a single item exclusive from the other items in a list of two or more items, then the use of or in such a list is to be interpreted as including (a) any single item in the list, (b) all of the items in the list, or (c) any combination of items in the list. Preferred embodiments and aspects of the invention will be described to explain the scope, structures and procedures of the invention. In addition to the preferred embodiments of the specification, the present invention can be widely applied in other embodiments.

Figure 1:
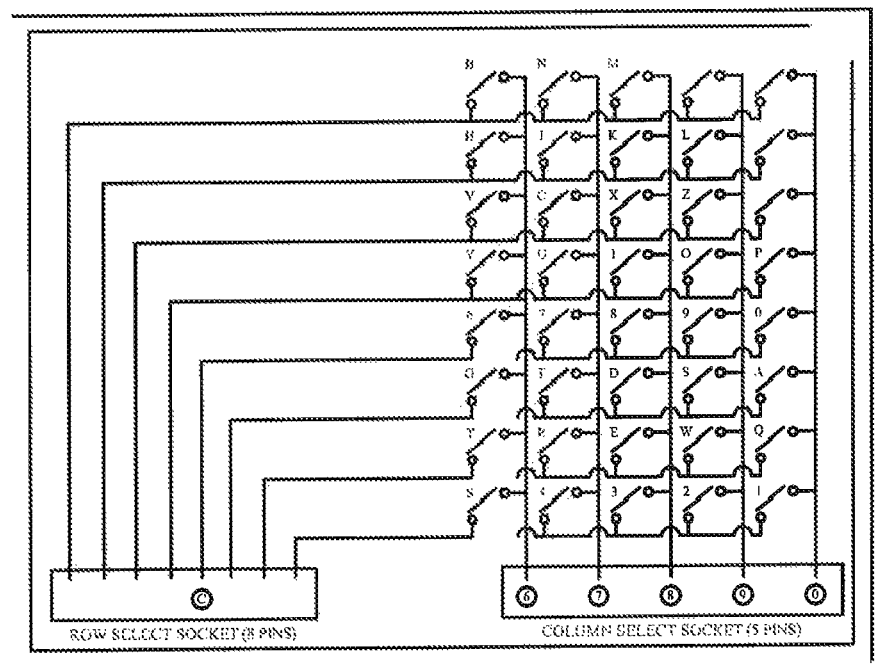
FIG. 1 is a circuit diagram of a conventional contact type keyboard.
Figure 2:
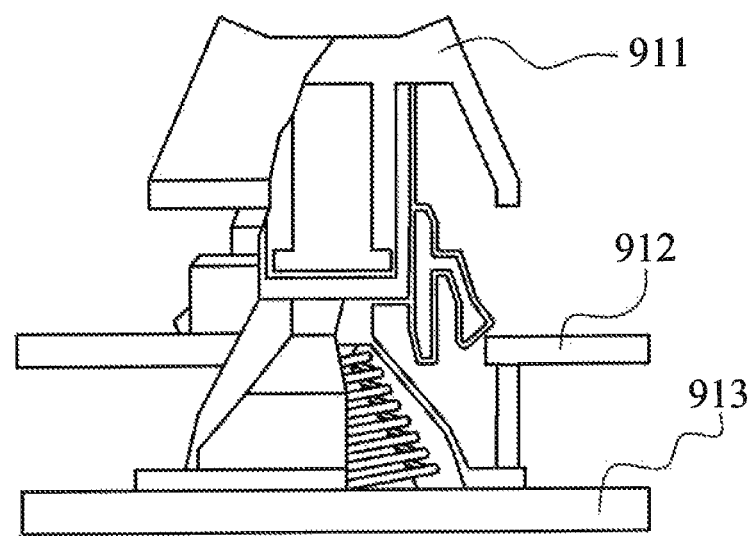
FIG. 2 is a illustration of a conventional mechanical capacitive keyboard.
Figure 3:
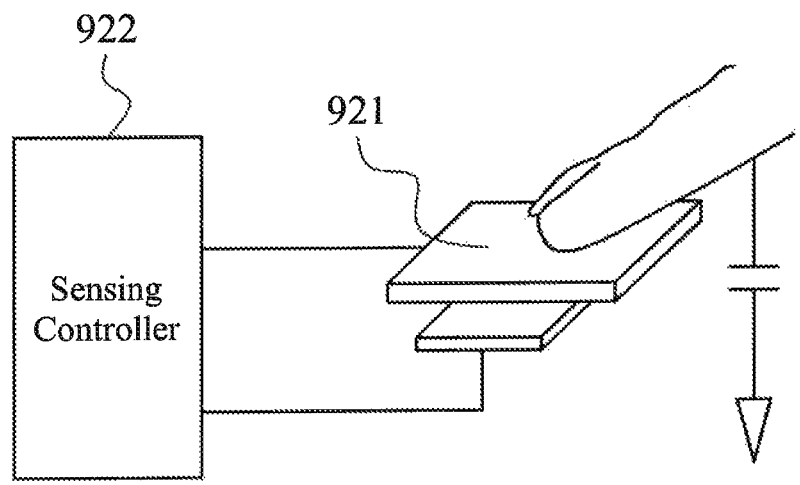
FIG. 3 is an illustration of a conventional touch button type capacitive keyboard.
Figure 4A:
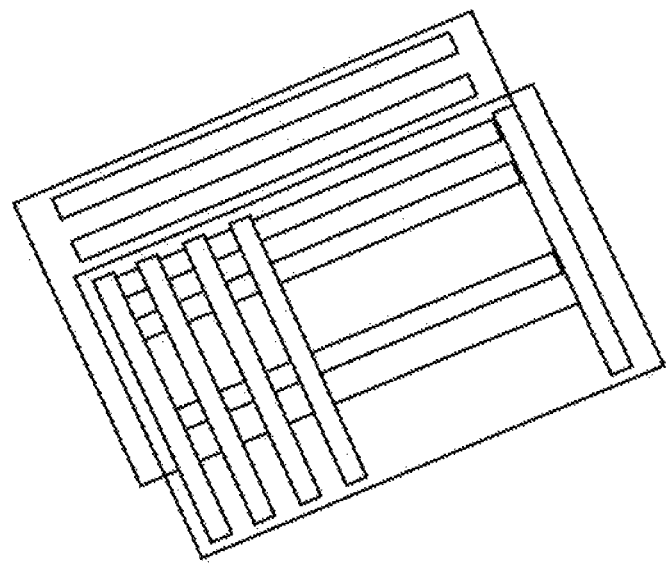
FIGS. 4A and 4B show illustrations of two conventional two dimensional capacitance sensing structure.
Figure 4B:
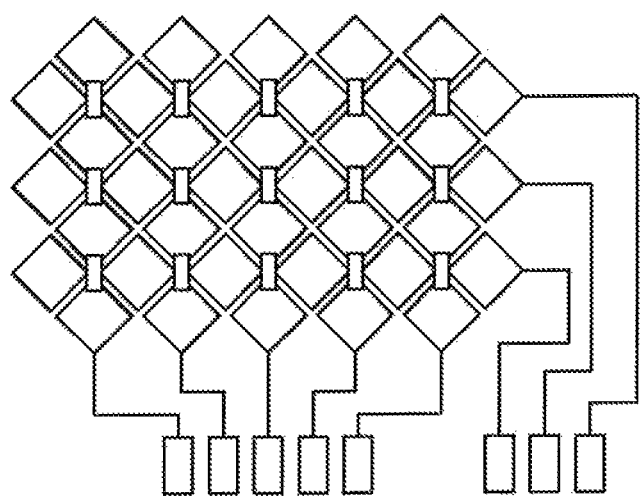
Figure 5:
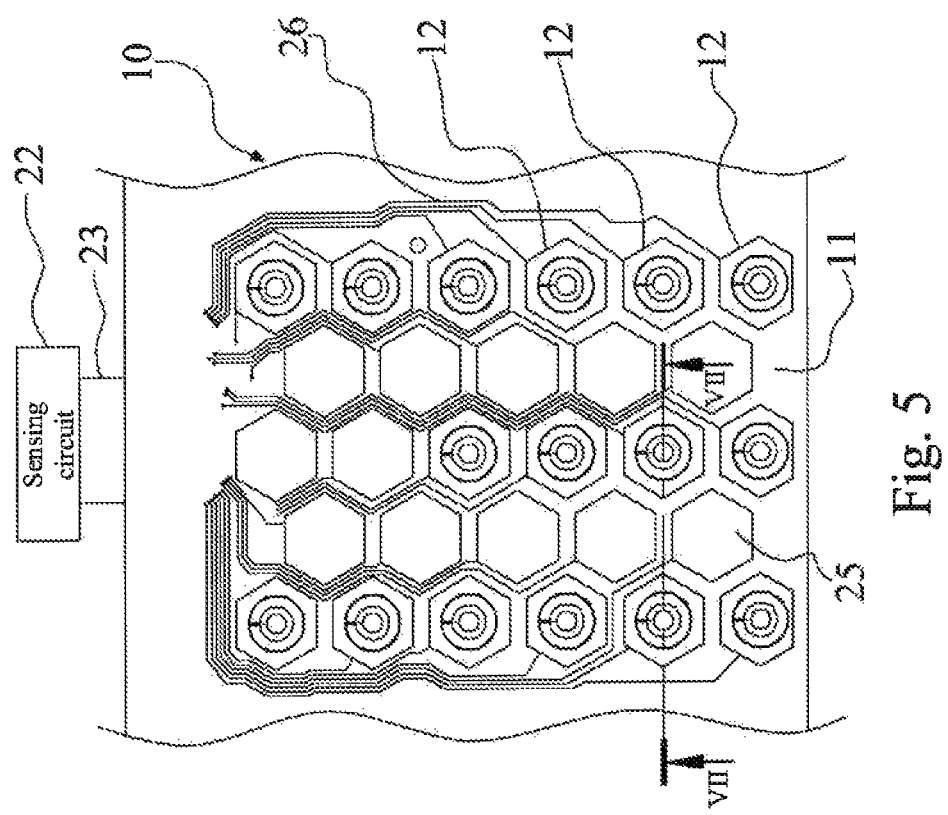
FIG. 5 is an illustration of a capacitive touch keyboard according to a first embodiment of the present invention.
Figure 6:
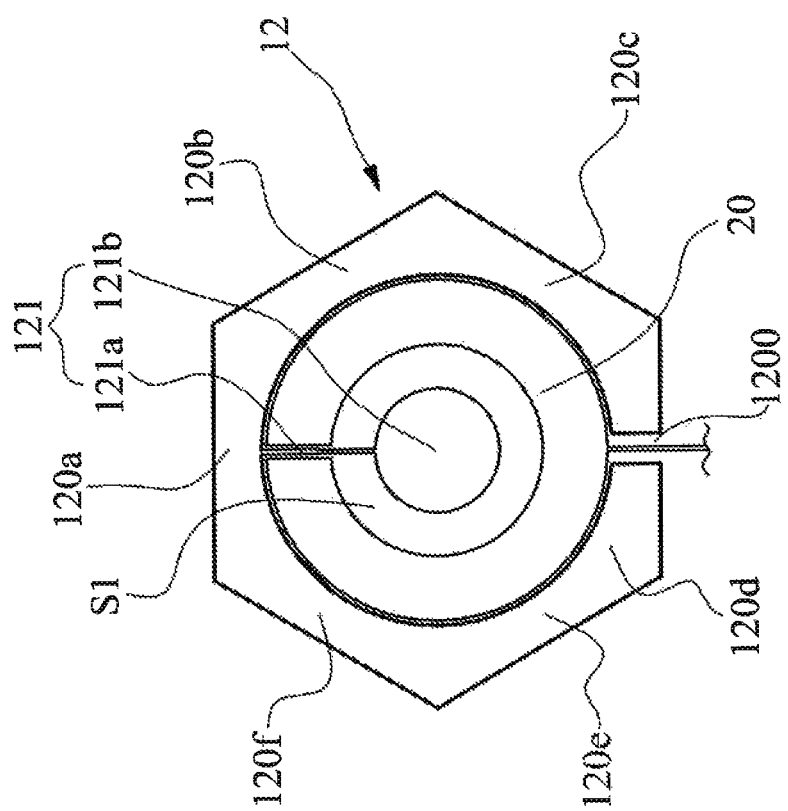
FIG. 6 is an illustration of a single key sensing cell in FIG. 5.
Figure 7:
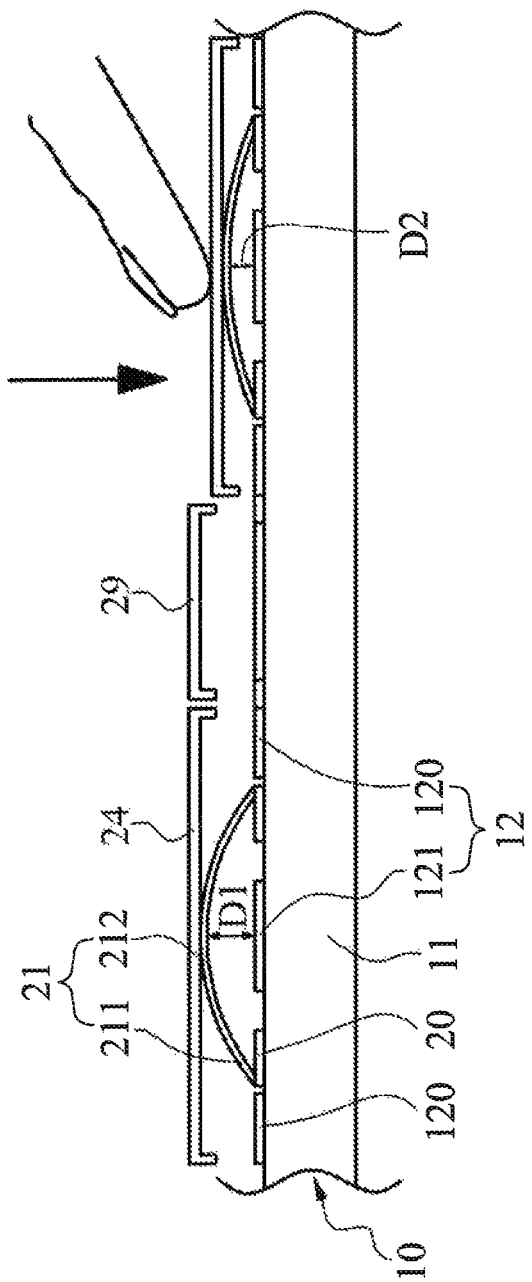
FIG. 7 is a cross sectional view taken along line VII-VII in FIG. 5.

Referring to FIG. 5, an illustration of a capacitive touch keyboard according to a first embodiment of the present invention, to FIG. 6, an illustration of a single key sensing cell in FIG. 5, and to FIG. 7, a cross sectional view taken along line VII-VII in FIG. 5; this example shows that a capacitive touch keyboard mainly includes a sensor layer 10, plural ground planes 20, plural flexible sensed bodies 21, and a capacitance sensing circuit 22 where the sensor layer 10 includes a substrate 11 and plural key sensing cells 12 and all of the key sensing cells 12 along with the ground planes 20 are disposed on the substrate 11 of the sensor layer 10.

In this embodiment, each of the key sensing cells 12 has a hexagonal contour, including a frame 120 and an inner protrusion 121. The frame 120 includes six connected sides 120a to 120f which form a loop to define an inner space S1, and the inner protrusion 121 includes a straight section 121a and a circular section 121b lying within the inner space S1. The straight section 121a of the inner protrusion 121 extends from the side 120a of the key sensing cell 12 toward the inner space S1 and terminates at the circular section 121b.

Each ground plane 20 also lies within the corresponding inner space S1, rendering a notched ring (C-type member) surrounding the inner protrusion 121 without contacting. Based on such layout, required area is saved to a great extent.

The flexible sensed body 21 includes a connected portion 211 and a sensed portion 212, wherein the connected portion 211 is connected and thus equipotential with the ground plane 20, and the sensed portion 212 extends integrally from the connected portion 211 to above the inner protrusion 121 of the key sensing cell 12. Due to separation of the flexible sensed body 21 from the key sensing cell 12, two elements jointly form a capacitor structure. FIG. 7 shows a clearance D1 between the flexible sensed body 21 and the inner protrusion 121 of the key sensing cell 12 when a key cap 24 has not been depressed yet.

As shown in the figure, the flexible sensed body 21 in the example is made as a metallic dome which spans the inner protrusion 121. From FIG. 7 it can be seen that the inner protrusion 121 is covered by the flexible sensed body 21.

Each flexible sensed body 21 resiliently supports a key cap 24, which is adapted for recognition by users to input and therefore may be imprinted at its surface with key labels. In FIG. 7 the key cap 24 is shown to extend to right above the frame 120.

The sensor layer 10 is a PCB or a film with silver paste printing, which is, in this case, a one dimensional sensor layer. Optionally a gesture sensing cell 25 of identical contour to the sensing cell 12 may be interposed between the adjacent key sensing cells 12, which will be detailed below. In any case, all sensing cells are arranged to form a honeycomb pattern. Each sensing cell is electrically connected to a sensing circuit 22 through an individual conducting line 26, where all conducting lines 26 may be integrated in a flexible printed circuit (FPC) 23.

The ground planes 20 may be made of such as copper, carbon, silver paste, indium tin oxide (ITO), antimony doped tin oxide (ATO), indium zinc oxide (IZO), zinc oxide (ZnO) or the like, as well as combination of those mentioned above. In consideration of contacting with system ground, the ground plane 20 is configured to run through an notch 1200 of the frame 120; or alternatively, the Ground plane 20 may be configured to penetrate the substrate 11 reaching the opposite side.

When a specified key cap of the keyboard has not been depressed yet (even none of objects touches or approaches on it), the capacitance sensing circuit 22 probes a certain capacitance value C0 for clearance of D1 condition depicted in FIG. 7. Once the key cap above is depressed the probed capacitance value changes to C2 (greater than C0) as the flexible sensed body 21 bends toward the inner protrusion 121 such that a change of clearance therebetween occurs from D1 to smaller value of D2. In addition, since the clearance of zero resulting from deep depressing a key also causes a voltage change, the capacitance sensing circuit 22 may further include a function of sensing the voltage change for identifying different operations. That is, the sensing circuit is electrically connected to the key sensing cells for sensing both an electronic parameter change correlating to the clearance between a selected one of the key sensing cells and the corresponding one of the flexible sensed bodies, and a capacitance change resulting from a finger movement above and among the plurality of key sensing cells. The electronic parameter change may be a capacitance change or a voltage change when the clearance between one of the key sensing cells and the ground plane is substantially zero as the key sensing cells and the ground plane are in contact with each other.

In addition, when an object such as a finger approaches or even touch but without depressing on the key cap, a coupled finger capacitance is produced by the finger and the frame 120 of the sensing cell 12 so that the probed capacitance value further changes to C1 between C0 and C2. That is to say, due to the fact that the frame 120 is not shielded by the flexible sensed body 21, a proximate detection (also including gesture operation) is possible when a finger approaches.

It is understood from above, the keyboard structure of the present invention provides not only depression tactile feel for users but also extended functionalities based on various sensed conditions, adding extra values to the product. Especially, unlike conventional keyboard with dome component, the present invention allows a keyboard to be pushed down only a little distance without a need of contact between the dome and the key sensing cell for its normal function, and hence fatigue caused by repeated substantial bending and wearout of components can be avoided effectively.

The gesture sensing cell 25 additionally provided between the key sensing cells is described here now. Whole keyboard structure may be so configured that adjacent key caps is separated at a predetermined distance, hereinafter a between-keys space, which corresponds to where the gesture sensing cell 25 is disposed. Without blocking of any ground plane, when a finger approaches the between-keys space, a coupled capacitance is produced by the finger and the gesture sensing cell 25 and then probed by the capacitance sensing circuit.

Figure 8:
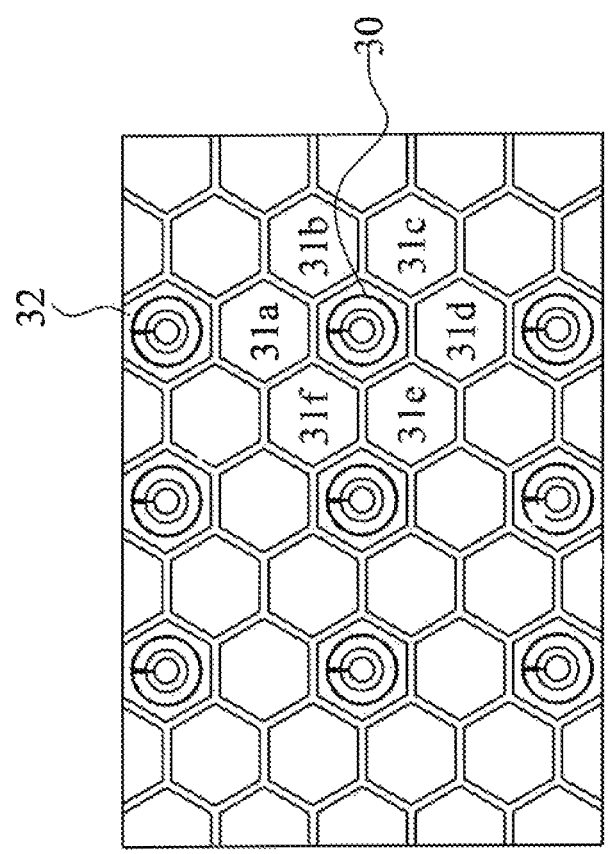
FIG. 8 is an illustration of a capacitive touch keyboard according to a second embodiment of the present invention.

In example of FIG. 5, the gesture sensing cells 25 exist between the adjacent key sensing cells 12 only in terms of horizontal direction, though it is not intended to limit the scope of the present invention. As shown in the figure, a cover 29 is also provided above the between-keys space for preventing a finger from direct touching on the gesture sensing cells 25 and for the finger swiping on. For example, multiple gesture sensing cells 25 may be disposed corresponding to a between-keys space with larger area so that a swiping motion by user's finger on the cover 29 can be detected to perform an unlock or page flipping function. For example, FIG. 8 shows another arrangement, in which any key sensing cells such as cell 30 neighbors six gesture sensing cells 31a to 31f, which means any key cap and each of its adjacent counterparts define a between-keys space in terms of horizontal and vertical directions simultaneously. For any given key sensing cell, the six neighboring sensing cells can be shared by other key sensing cells, just as gesture sensing cell 31a shared by key sensing cells 30 and 32. The gesture sensing cell is not required to be configured as the key sensing cell including a frame and an inner protrusion, and instead it may be a complete solid sheet. In order to substantially equalize capacitances of all sensing cells in overall device, which requires area of the gesture sensing cell to be substantially equal to that of the frame of the key sensing cell, the gesture sensing cell may be shaped to be hollow-carved or to be a downsized hexagon.

The sensor layer specifically comprises a substrate which may be PCB, the film or the glass sheet; and sensing cells, which may be transparent, fabricated on the substrate. The sensing cells are formed with hexagon shapes and the pattern of the entire sensing cells is arranged to have the honeycomb configuration. As shown in the figure, the pluralities of the individual hexagons are arranged with seven hexagons to form a unit. One hexagon is surrounded by six adjacent hexagons. The center sensing cell may indicate one output signal when it is touched, and the center sensing cell with one of the adjacent sensing cells may indicate another output signal when the two sensing cells are touched. By the same reason, the combination of three, four and more sensing cells may be used to indicate certain output signal. Therefore, the unit of the sensor configuration may provide multiple output signals to indicate different instructions. The sensing cells are electrically connected to the control circuits. Thus, the touch panel of the invention can further locate the position of the finger more precisely. Therefore, although the sensing cell of the invention may be much larger than the sensing cell of the traditional touch panel, however, the touch panel of the invention can locale the position of the finger precisely and the unit of the present invention may output multiple signals.

Consequently, the sensing circuit is able to identify location of the finger and to track its movement, that is to say the between-keys space offers a gesture operation function, provided that definition is pre-set in related control circuit.

The honeycomb pattern formed by sensing cells is especially useful in the keyboard device with gesture operation function in that not only the sensing cells can be arranged in more compact form without wasting occupied area, but the maximum number of stimulus and sensing combination (63 for single cell, and more for cell grouping) (and thus better signal resolution) is provided.

Figure 9:
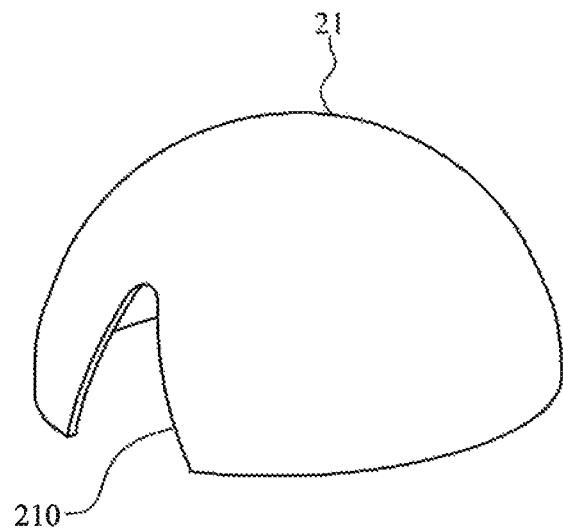
FIG. 9 is a perspective view of the flexible sensed body of dome type.

In order to separate the flexible sensed body 21 and the straight section 121a, the flexible sensed body 21 can be made as a dome with a notch 210 formed on the connected portion 211 (shown in FIG. 9) so that the connected portion 211 contacts the ground plane 20 in incomplete annular way. Such design allows manufacturing by a single-layered PCB.

Figure 10:
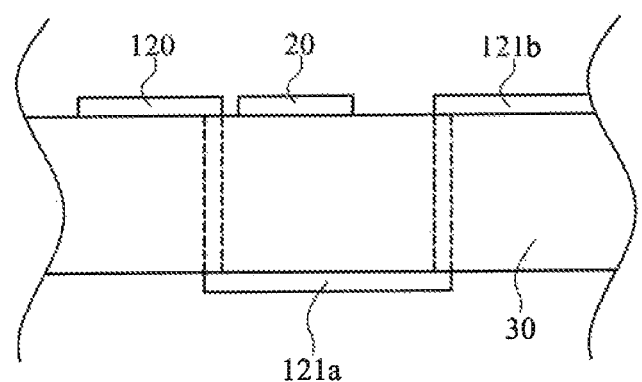
FIG. 10 shows a modified arrangement of the straight section with respect to the circular section on a double-layered PCB.

If a dome without a notch on the connected portion is desired, an isolation material such as solder mask used in PCB manufacturing can be applied on the straight section 121a, and consequently a proportion of the connected portion 211 rests on the material without contacting the key sensing cell 12; alternatively, as shown in FIG. 10, a double-layered PCB 30 can be utilized, in which the straight section 121a is arranged on the opposite side to the circular section 121b by interconnecting technique, not only keeping the flexible sensed body 21 and the key sensing cell 12 separated, but also eliminating a need for isolation material.

Figure 12:
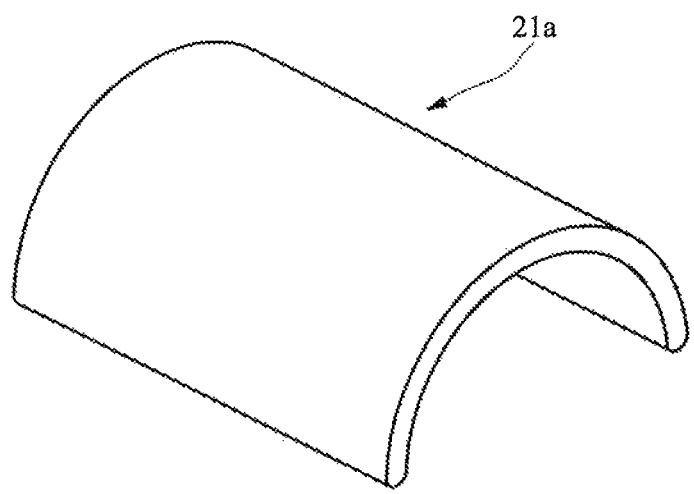
FIG. 12 is an alternative to the flexible sensed body in FIG. 9.

In a modified embodiment, the flexible sensed body 21a is shaped as a channel structure, as shown in FIG. 12, which is also prevented from contacting the sensing cell.

Figure 11:
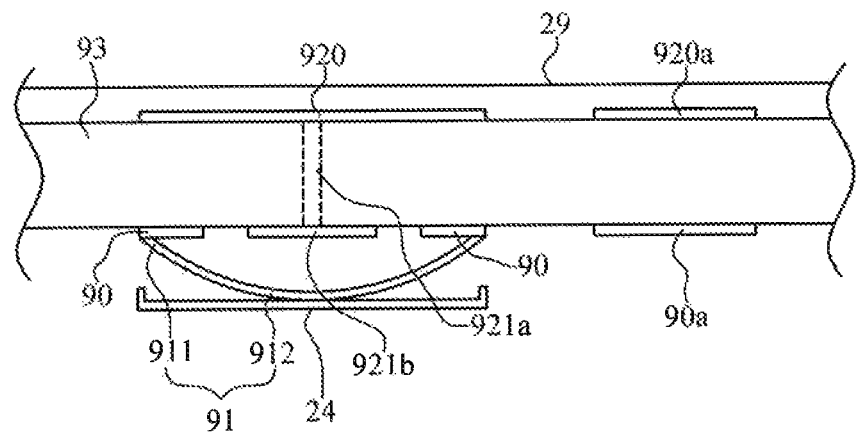
FIG. 11 is a cross sectional view of a capacitive touch keyboard according to a third embodiment of the present invention.

Referring to FIG. 11, a cross sectional view of a capacitive touch keyboard according to a third embodiment of the present invention, this embodiment illustrates an modification of the capacitive touch keyboard shown in FIG. 7. A capacitive touch keyboard includes a sensor layer, a ground plane 90 including a substrate 93 and a key sensing cell formed on the substrate 93, a flexible sensed body 91 including a connected portion 911 and a sensed portion 912, and a sensing circuit (not shown).

The key sensing cell includes a first part 920 and a second part 921b disposed on opposite sides of the substrate 93, and the two parts 920 and 921b are electrically connected with each other by an interconnecting line 921a which runs through the substrate 93. The ground planed 90 lies on the same side as the second part 921b and surrounds the second part 921b. The flexible sensed body 91 rests on the ground plane 90 with its connected portion 911 such that the sensed portion 912 extends to above the second part 921b of the key sensing cell. The flexible sensed body 91 and the key sensing cell jointly form a capacitor structure, as that of the first embodiment.

Therefore, a keyboard user can perform a depressing operation via the flexible sensed body 91 on one side and a gesture operation via the first part 920 on the other side. In addition, also shown are an auxiliary sensing cell 920a and an auxiliary ground plane 90a, disposed on opposite sides of the substrate 93, for gesture operation and shielding effect purposes respectively.

According to techniques above, when applied to keyboard, following designs may be implemented for different use mode or providing various extended functions.

Depress any key or pre-defined time out (no touch for a time period) to lock keyboard touch function;

Manipulate on a space bar of a keyboard for various operations: (1) left (or right) double tap to enter/exit horizontal (or vertical) scrolling mode; (2) single flick to unlock keyboard touch function; (3) double flick to enter fine resolution mode;

Use composite keys "shift+space" to enter/exit horizontal (or vertical) scrolling mode or fine resolution mode;

Multi-finger one time or double tap to perform the same function as left (or right) clicking or double clicking by a mouse;

Partition the whole keyboard into several key zones, each zone including several keys, applied in entertainment inputting device.

In the case of remote controller, some gesture operations are demonstrated below.

During play mode, flick to perform previous/next function;

Single circle clockwise/counterclockwise to perform forward/reverse function;

Double tap to perform pause function during play mode and to perform back to normal function during forward/reverse mode;

Double circle clockwise/counterclockwise to perform fast forward/fast reverse function;

Horizontal or vertical flick to perform adjustment of channel or volume, channel could be "chapter" under play mode.

The foregoing description, for purposes of explanation, was set forth in specific details of the preferred embodiments to provide a thorough understanding of the invention. However, it will be apparent to one skilled in the art that specific details are not required in order to practice the invention. Therefore, the foregoing descriptions of specific embodiments of the invention are presented for purposes of illustration and description only and should not be construed in any way to limit the scope of the invention. They are not intended to be exhaustive or to limit the invention to the precise forms disclosed; obviously, many modifications and variations are possible in view of the above teachings. The embodiments were chosen and described in order to best explain the principles of the invention and its practical applications, thereby enabling others skilled in the art to best utilize the invention and various embodiments with various modifications as are suited to the particular use contemplated. It is intended that the following Claims and their equivalents define the scope of the invention.

What is claimed is:

1. A capacitive touch keyboard, comprising:
a sensor layer comprising a substrate and a key sensing cell;
a ground plane disposed along with the key sensing cell on the substrate and spaced apart from the key sensing cell;
a flexible sensed body comprising a sensed portion and a connected portion, wherein the connected portion is connected with the ground plane and the sensed portion extends from the connected portion to above the key sensing cell such that the flexible sensed body and the key sensing cell jointly form a capacitor structure; and
a sensing circuit electrically connected to the key sensing cell to probe a capacitance change.

2. The capacitive touch keyboard of claim 1, wherein the key sensing cell comprises six sides and an inner protrusion, the six sides defining an inner space into which the inner protrusion extends from one of the sides, the ground plane within the inner space surrounding the inner protrusion without contact, the flexible sensed body being connected with the ground plane and spanning the inner protrusion.

3. The capacitive touch keyboard of claim 1, wherein the sensor layer comprises a plurality of key sensing cells disposed on the substrate and corresponding to a plurality of flexible sensed bodies, respectively, and the key sensing cells comprise respective circumferential portions uncovered from the corresponding flexible sensed bodies.

4. The capacitive touch keyboard of claim 3, wherein the sensing circuit is electrically connected to the plurality of key sensing cells for sensing both an electronic parameter change correlating to the clearance between a selected one of the key sensing cells and the corresponding one of the flexible sensed bodies, and a capacitance change resulting from a finger movement above and among the plurality of key sensing cells.

5. The capacitive touch keyboard of claim 4, wherein the electronic parameter change is a capacitance change.

6. The capacitive touch keyboard of claim 4, wherein the electronic parameter change is a voltage change when the clearance between one of the key sensing cells and the ground plane is substantially zero as one of the key sensing cells and the ground plane are in contact with each other.

7. The capacitive touch keyboard of claim 2, wherein the key sensing cell has a hexagonal contour.

8. The capacitive touch keyboard of claim 1, wherein the flexible sensed body refers to a dome.

9. The capacitive touch keyboard of claim 1, wherein the flexible sensed body refers to a metallic dome.

10. The capacitive touch keyboard of claim 1, wherein the sensor layer is connected to the capacitance sensing circuit through an FPC.

11. The capacitive touch keyboard of claim 1, wherein the key sensing cell comprises a first part and a second part on opposite sides of the substrate and electrically connected with each other, and the sensed portion extends to above the second part.

12. A capacitive touch keyboard, comprising:
a sensor layer comprising a substrate and plural key sensing cells, wherein each key sensing cell comprises six sides and an inner protrusion, the six sides being looped to define an inner space and the inner protrusion extending from one of the sides into the inner space;
plural ground planes corresponding to the plural key sensing cells and being disposed along with the key sensing cells on the substrate and spaced apart from the key sensing cells, wherein each of the ground planes surrounds the inner protrusion without contact within the corresponding inner space;
plural flexible sensed bodies corresponding to the plural key sensing cells, wherein each of the sensed bodies comprises a sensed portion and a connected portion, the connected portion being connected with the corresponding ground plane and the sensed portion extending from the connected portion to above the inner protrusion of the corresponding key sensing cell such that the corresponding flexible sensed body and the key sensing cell jointly form a capacitor structure; and
a sensing circuit electrically connected to each of the key sensing cells to probe a capacitance change.

13. The capacitive touch keyboard of claim 12, wherein the adjacent key sensing cells are provided with a gesture sensing cell therebetween.

14. The capacitive touch keyboard of claim 12, wherein all of the sensing cells are arranged to form a honeycomb pattern.

15. The capacitive touch keyboard of claim 12, wherein the flexible sensed bodies includes a dome.

16. The capacitive touch keyboard of claim 12, wherein each of the key sensing cells is shaped to be hexagonal.

17. The capacitive touch keyboard of claim 12, wherein the flexible sensed bodies includes a metallic dome.

18. The capacitive touch keyboard of claim 12, wherein the sensing circuit is electrically connected to the key sensing cells for sensing both an electronic parameter change correlating to the clearance between a selected one of the key sensing cells and the corresponding one of the flexible sensed bodies, and a capacitance change resulting from a finger movement above and among the plurality of key sensing cells.

19. The capacitive touch keyboard of claim 18, wherein the electronic parameter change is a capacitance change.

20. The capacitive touch keyboard of claim 18, wherein the electronic parameter change is a voltage change when the clearance between one of the key sensing cells and the ground plane is substantially zero as one of the key sensing cells and the ground plane are in contact with each other.

\* \* \* \* \*